United States Patent [19]
Makuta

[11] Patent Number: 5,212,712
[45] Date of Patent: May 18, 1993

[54] LASER DEVICE AND METHOD OF MANUFACTURING THE SAME

[75] Inventor: Akio Makuta, Yokohama, Japan

[73] Assignee: Kabushiki Kaisha Toshiba, Kanagawa, Japan

[21] Appl. No.: 778,948

[22] PCT Filed: Apr. 17, 1991

[86] PCT No.: PCT/JP91/00501
§ 371 Date: Jan. 23, 1992
§ 102(e) Date: Jan. 23, 1992

[30] Foreign Application Priority Data

Apr. 19, 1990 [JP] Japan ................... 2-101591

[51] Int. Cl.$^5$ ................................ H01S 3/08
[52] U.S. Cl. ........................ 372/96; 372/45; 372/102
[58] Field of Search ........... 372/96, 45; 11/50, 102

[56] References Cited

U.S. PATENT DOCUMENTS

| | | | |
|---|---|---|---|
| 4,775,980 | 10/1988 | Chinone et al. | 372/96 |
| 4,796,273 | 1/1989 | Yamaguchi | 372/96 |
| 4,847,856 | 7/1989 | Sugimura et al. | 372/96 |

FOREIGN PATENT DOCUMENTS

| | | | |
|---|---|---|---|
| 0260185 | 10/1958 | Japan | 372/96 |
| 0000185 | 1/1985 | Japan | 372/96 |
| 61-88584 | 6/1986 | Japan . | |
| 0095886 | 5/1987 | Japan | 372/96 |
| 0166282 | 7/1988 | Japan | 372/96 |

OTHER PUBLICATIONS

K. Utaka et al., "λ/4-Shifted InGaAsP/InP DFB Lasers by Simultaneous Holographic Exposure of Positive and Negative Photoresists," Electronics Letters vol. 20, No. 24, pp. 1008-1010, Nov. 22, 1984.

H. Soda et al., "Stability on Single Longitudinal Mode Operation in GaInAsP/InP Phase-adjusted DFB Lasers," IEEE Journal of Quantum Electronics vol. QE-23, No. 6, pp. 804-814, Jun. 1987.

T. Kimura et al., "Linewth Reduction by Coupled Phase-Shift Distributed-Feedback Lasers," Electronics Letters vol. 23, No. 19, pp. 1014-1015, Sep. 10, 1982.

Kinoshita et al., "Transient Chirping in Distributed Feedback Lasers: Effect of Spatial Hole-Burning Along the Laser Axis," IEEE Journal of Quantum Electronics vol. 24, No. 11, pp. 2160-2169, Nov. 1988.

Yamaguchi et al., "Phase shifted DFB-DC-PBH LD in 1.55 μm wavelength range," Electronics, Information, and Communication Society Research Report OQE8-6-150, pp. 33-37.

Primary Examiner—Georgia Y. Epps
Attorney, Agent, or Firm—Finnegan, Henderson, Farabow, Garrett & Dunner

[57] ABSTRACT

A phase shift region is formed in a waveguide layer constituting a laser device. The phase shift region is a recess portion formed in the waveguide layer, and a periodic projection structure is formed on the surface of the waveguide layer including the recess portion. The recess portion can be formed by etching using an agent having weak etching anisotropy. Optical feedback can be performed while concentration of light in the phase shift region is suppressed.

8 Claims, 10 Drawing Sheets

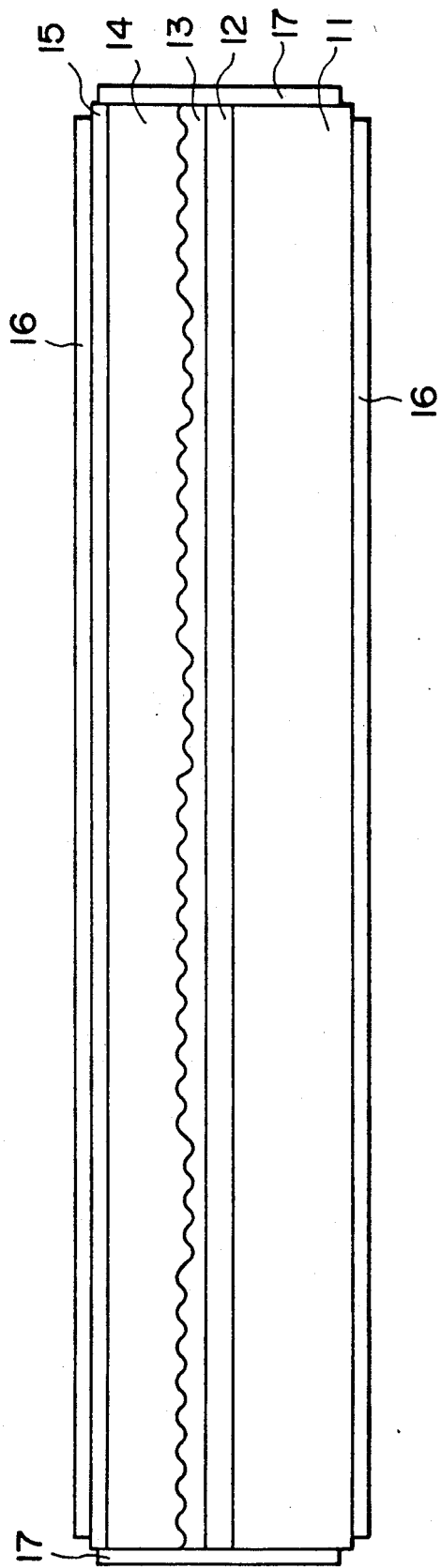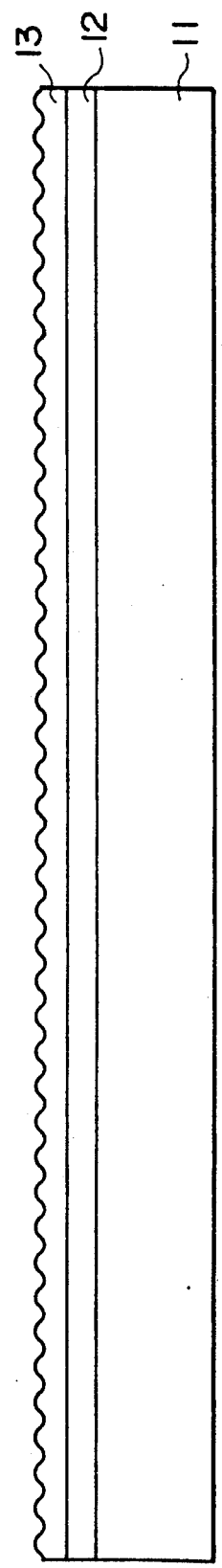
FIG. 8
FIG. 9A

LASER DEVICE AND METHOD OF MANUFACTURING THE SAME

BACKGROUND OF THE INVENTION

1. Field of the Invention

The present invention relates to a phase-shifted distributed feedback laser device in which an effective refractive index of a laser active layer is discontinuous, and an improvement in a method of manufacturing the same.

2. Description of the Related Art

A DFB-LD (Distributed FeedBack-Laser Diode) plays an important role in long-distance large-capacity optical communication. A characteristic feature of this DFB-LD lies in a structure (i.e., a diffraction grating) in which a refractive index periodically changes in an optical waveguide. However, when cleavage of crystals is used in a reflecting mirror, it is difficult to oscillate the DFB-LD in a single longitudinal mode because the phase of a diffraction grating at the end of the DFB-LD has an adverse effect on oscillation in the single longitudinal mode.

Therefore, the following proposals have been made for the DFB-LD in terms of a device structure.

First, a $\lambda/4$-shifted DFB laser in which the phase of a diffraction grating is shifted by $\pi$ ($\pi/2$ as the phase of an oscillation frequency) in a central portion of a laser resonator has been developed (this laser is described in, e.g., Electronics Letters vol. 20, NO 24, 1984, pp 1,008 to 1,010). According to this proposal, laser light reliably oscillates in a single longitudinal mode. Second, an effective refractive index type $\lambda/4$-shifted DFB laser in which the width of a waveguide is changed in a central portion of a laser resonator to change the effective refractive index of an active medium has been developed. A characteristic feature of this proposal is that because the phase of waveguide light changes in a portion where the width of the waveguide changes, an effect similar to that obtained when a diffraction grating is shifted can be equivalently obtained (this laser is described in, e.g., IEEE JOURNAL OF QUANTUM ELECTRONICS. VOL. QE-23, NO 6 JUNE 1987 pp 804 to 814).

In the $\lambda/4$-shifted DFB laser in which the phase of a diffraction grating is shifted, however, when a coupling coefficient $\kappa$ indicating a feedback quantity of a light wave is large, light reciprocated in a resonator is easily concentrated on a phase shift portion A of the diffraction grating, as shown in FIGS. 1A and 1B. Therefore, the performance of the laser is largely degraded, e.g., hole burning in the axial direction results, causing saturation of an optical output (this is described in, e.g., IEEE JOURNAL OF QUANTUN ELECTRONICS. VOL. 24, NO 11, November 1988). On the contrary, when the coupling coefficient $\kappa$ is small, light reciprocated in the resonator is easily concentrated on end faces B of the diffraction grating, as shown in FIGS. 2A and 2B. Therefore, it is very difficult to adjust the coupling coefficient $\kappa$, e.g., a threshold current rise or no satisfactory suppression ratio with an adjacent mode. Referring to FIGS. 1A and 2A, reference numeral 1 denotes an InP substrate; 2, a waveguide layer; 3, an active layer; 4, a cladding layer; 5, a contact layer; 6, electrodes; and 7, AR films.

In addition, in the DFB-LD in which the width of a waveguide is changed, concentration of light is decreased in a region where the phase is shifted. However, since even a waveguide having a uniform width is difficult to form, it is very difficult to control the width, the shape, or the like of a region where the phase is shifted. This proposal, therefore, is not useful unless a control apparatus capable of precisely controlling the width of a waveguide is developed. Furthermore, the far field pattern of output light undesirably large projections.

The following proposals have been made for the DFB-LD in terms of a manufacturing method.

First, a method of using both negative and positive resists in order to shift the phase of a diffraction grating has been developed (this method is described in, e.g., Electronics Letters vol. 20, NO 24, 1984, pp 1,008 to 1,010). Second, a method of using a phase shift film has been developed (this method is described in, e.g., Electronics, Information, and Communication Society Research Report OQE86-150). However, neither of the above methods can provide a DFB-LD with a high yield. In addition, these methods of shifting the phase of a diffraction grating have drawbacks in that, e.g., a step is formed in a phase shift portion of the diffraction grating or the shape of the diffraction grating is changed in the shift portion.

In addition to the above proposals, the following proposals have been made for the DFB-LD.

First, a device in which the structure of a waveguide is changed to equivalently shift a phase has been developed. As a practical example of this proposal, a DFB-LD in which the thickness of the waveguide layer 2 of the distributed feedback laser device shown in FIG. 1A or 2A is changed is known (this device is described in, e.g., Published Unexamined Japanese Patent Application No. 61-88584). However, the DFB-LD in which the thickness of the waveguide layer is changed has the following drawbacks. When a waveguide layer is grown after grooves are formed in a substrate, a diffraction grating formed on the substrate is flattened by a conventional etching method. For this reason, no diffraction grating is present in a region where the phase is shifted. In addition, crystal orientation in a region where the diffraction grating is present is different from that in other flat regions. For this reason, various problems are posed, e.g., a change in crystallinity in the waveguide layer, nonuniform crystal growth, or formation of a step in the active layer. Furthermore, since control of the thickness of the grown layer is difficult, it is impossible to shift the phase by a desired making this structure impractical.

A method of forming a diffraction grating after a waveguide layer is grown, contrary to the above method, is known. In this method, an amount of phase shifting can be easily controlled. However, since the thickness of the waveguide layer changes, the thickness of a photoresist used to form the diffraction grating partially changes. As a result, the shape or depth of the diffraction grating cannot be maintained constant, or no diffraction grating is formed at all.

As a method of obtaining a small spectral line width, a method of forming a plurality of regions where a phase is shifted in a resonator has been proposed (this method is described by, e.g., T. Kimura et. el., Electron. lett. vol 23, pp 1,014, 1987). This method is suited to communication of coherent light. In order to realize this method, the above method of shifting a diffraction grating can be applied. However, since hole burning is caused in a region where the diffraction grating is shifted, a spectral line width is increased to be larger than a theoretical value.

On the other hand, the coupling coefficient $\kappa$ in a portion where the thickness changes is affected by an electric field distribution in a waveguide mode and therefore is different from the coupling coefficient $\kappa$ in other regions. Controlling the shape or depth of the diffraction grating in a region where the thickness changes is useful in that a change in coupling coefficient $\kappa$ caused by an electric field distribution difference is compensated. In addition, concentration of light in a region where the phase is shifted or a drop in light distribution must be prevented to flatten the light distribution, thereby adjusting the coupling coefficient $\kappa$. However, neither a device nor a manufacturing method satisfying these requirements are presently available.

SUMMARY OF THE INVENTION

The present invention has been made to solve the above problems and has as its objects to provide a laser device capable of suppressing concentration of light in a region where the phase of a diffraction grating is shifted, thereby obtaining a flat light distribution in a resonator, and to provide, in order to obtain the above laser device, a method of manufacturing a laser device capable of freely shifting the phase of a diffraction grating.

In order to achieve the above objects, in the laser device of the present invention, a phase shift region is formed in a waveguide layer. The phase shift region is a projecting portion or a recess portion formed in the waveguide layer. A periodic projection structure is formed on the surface of the waveguide layer including the projecting portion or the recess portion.

In the method of manufacturing a laser device of the present invention, a desired periodic projection structure is formed on the surface of a waveguide layer. Thereafter, a portion of the waveguide layer is etched while the shape of the periodic projection structure is controlled.

When the etched region is to serve as a phase shift region, the waveguide layer is etched by an agent having weak etching anisotropy. When the etched region is to serve as a region other than the phase shift region, the waveguide layer is etched by an agent having strong etching anisotropy.

BRIEF DESCRIPTION OF THE DRAWINGS

FIG. 8 is a sectional view showing a laser device according to the third embodiment of the present invention;

and FIGS. 9A-9D are sectional views showing a method of manufacturing the laser device shown in FIG. 8.

DESCRIPTION OF THE PREFERRED EMBODIMENTS

Figure 1A:
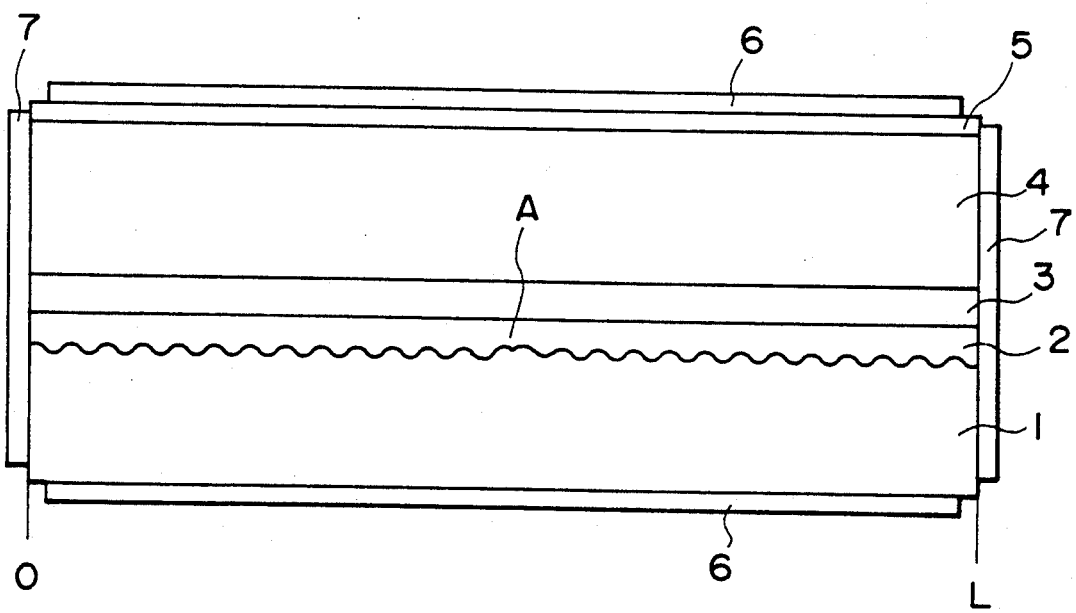
FIGS. 1A and 2A are sectional views showing conventional laser devices.

An embodiment of the present invention will be described in detail below with reference to the accompanying drawings. In this description, the same reference numerals denote the same parts throughout the drawings.

Figure 3:
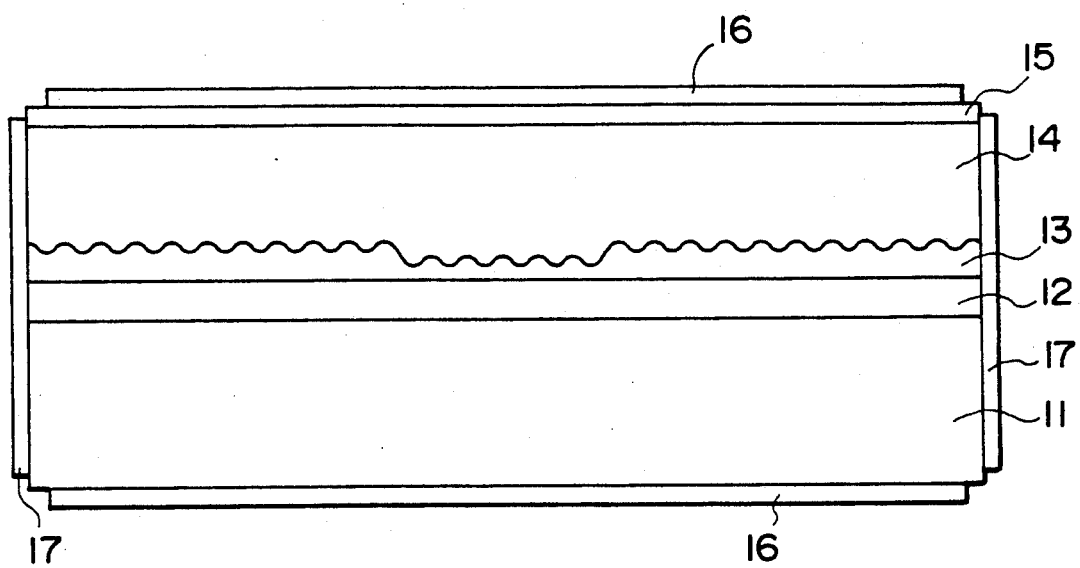
FIG. 3 is a sectional view showing a laser device according to the first embodiment of the present invention.

FIG. 3 shows a phase-shifted distributed feedback laser device according to the first embodiment of the present invention. Referring to FIG. 3, reference numeral 11 denotes an InP substrate; 12, a GaInAsP active layer; 13, an optical waveguide layer; 14, a cladding layer; 15, a contact layer; 16, electrodes; and 17, AR films.

In this device, a desired periodic projection structure for performing optical feedback is formed on the upper surface of the waveguide layer (optical waveguide) 13. The thickness of the waveguide layer 13 is not uniformly distributed but is partially changed, e.g., decreased to be smaller in a central portion of a resonator than that in other portions. An effect of shifting a phase is obtained by changing the thickness of the waveguide layer 13. A diffraction grating having a desired depth and a desired shape is present in a region where the thickness of the waveguide layer 13 is changed (to be referred to as a phase shift region hereinafter).

Figure 1B:
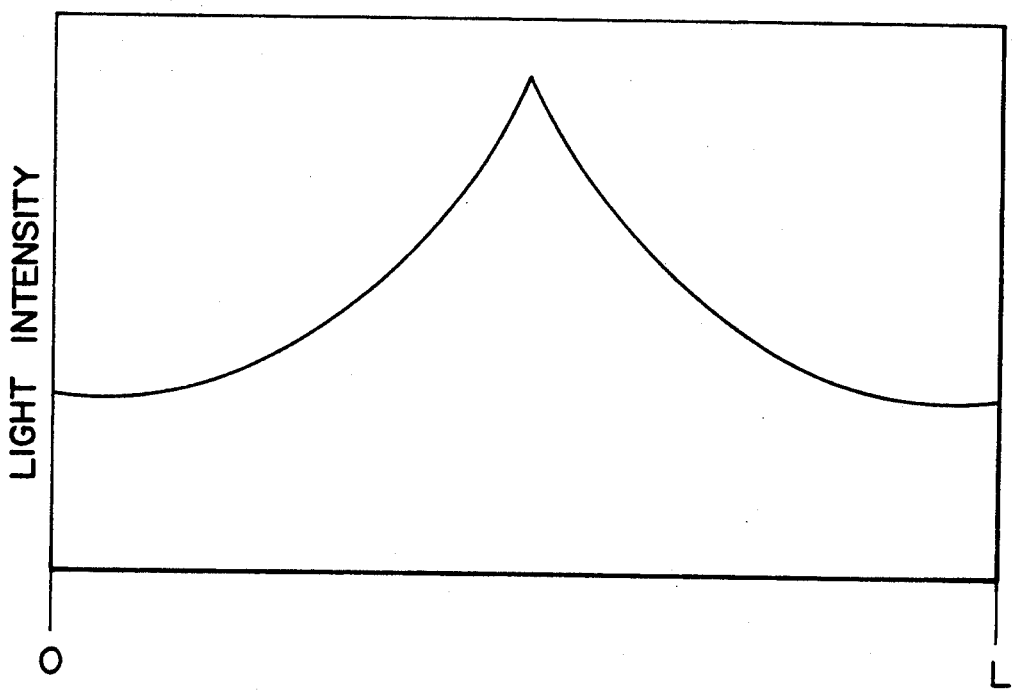
FIGS. 1B and 2B are views showing light intensity distributions of the conventional laser devices.
Figure 2A:
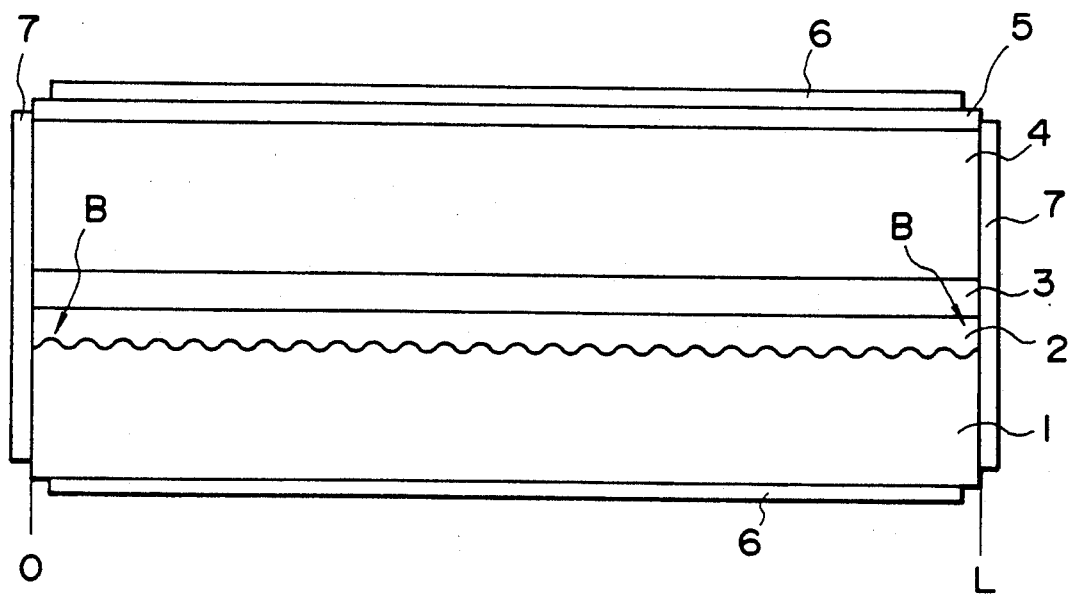
Figure 2B:
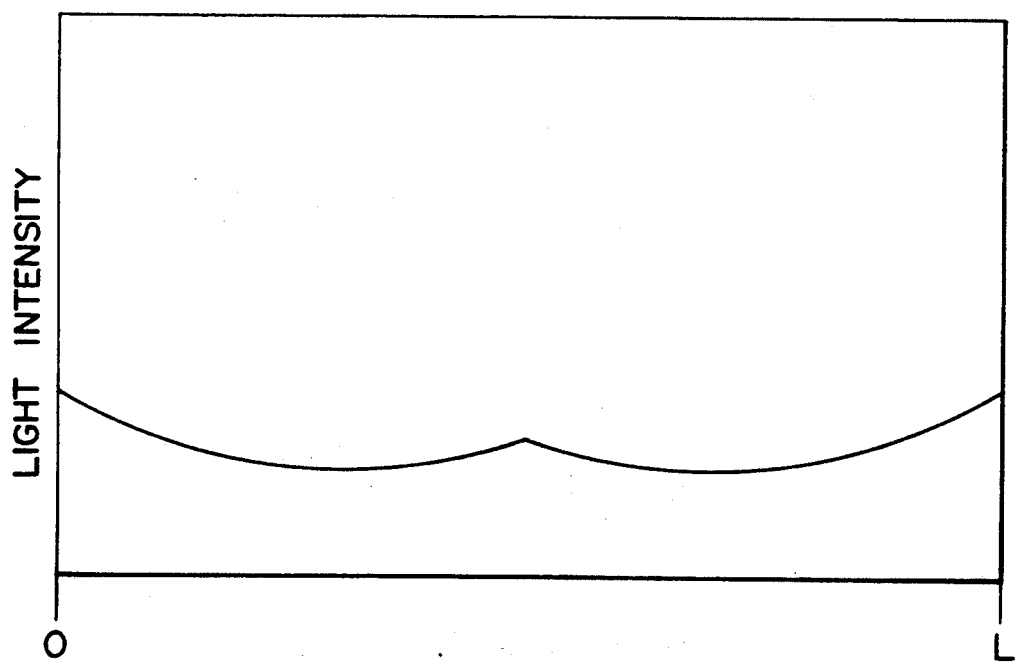

FIGS. 4A to 4D show a method of manufacturing the laser device shown in FIG. 1.

Figure 4A:
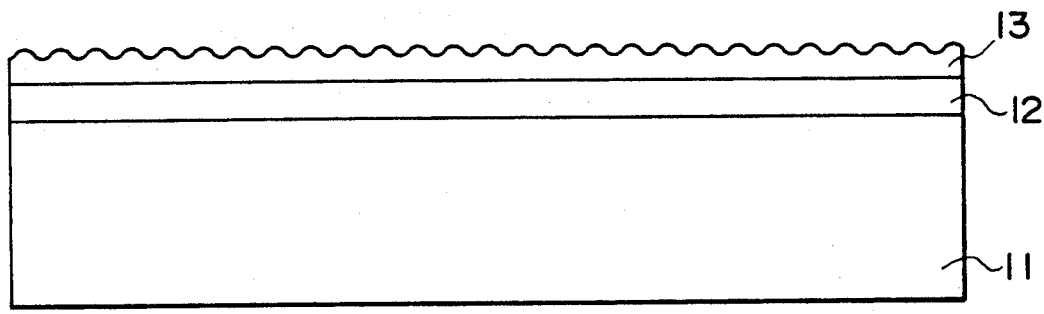
FIGS. 4A to 4D are sectional views showing a method of manufacturing the laser device shown in FIG. 3.
Figure 4B:
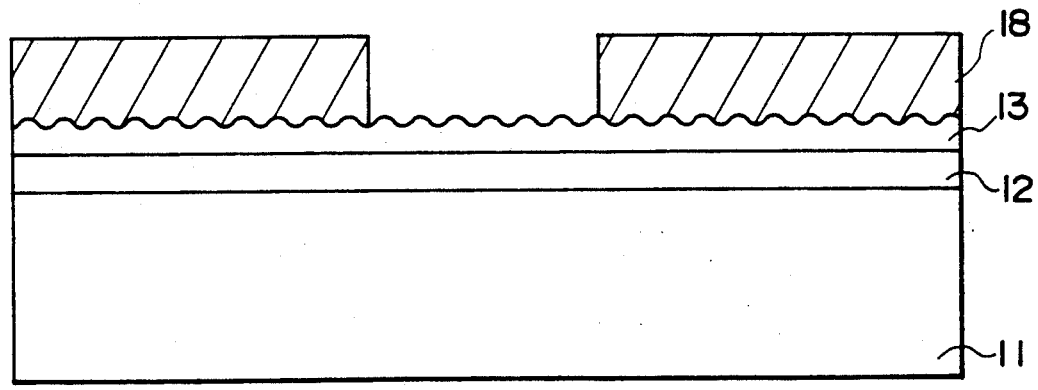
Figure 4C:
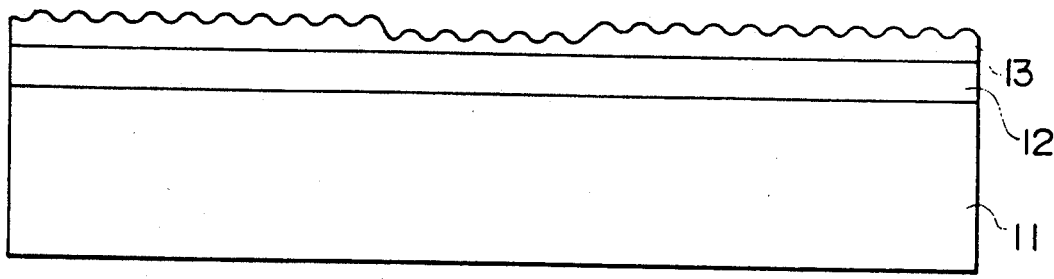

First, as shown in FIG. 4A, a GaInAsP active layer 12 and a waveguide layer 13 are sequentially crystal-grown on an InP substrate 11. Thereafter, a two-beam interference exposure method using a laser is used to form a diffraction grating on the waveguide layer 13. Subsequently, as shown in FIG. 4B, a photoresist 18 is formed on the waveguide layer 13. Thereafter, the photoresist 18 is patterned to expose the waveguide layer 13 at the central portion of a resonator. Subsequently, as shown in FIG. 4C, a sulfuric acid-based etchant is used to etch the waveguide layer 13 in the central portion of the resonator. Note that the etching amount of the waveguide layer 13 is sufficient to obtain a predetermined effective refractive index.

The reason why a sulfuric acid-based etchant is used as the agent for etching the waveguide layer 13 will be described. Hole burning occurs more easily as the thickness of the waveguide layer 13 is decreased because coupling of light is enhanced in a region where the waveguide layer 13 is thin. However, even when the waveguide layer 13 is thin, coupling of light can be weakened if a projection amount on the diffraction grating is small. For this reason, the sulfuric acid-based etchant having weak etching anisotropy is used to reduce the projections of the diffraction grating.

Figure 4D:
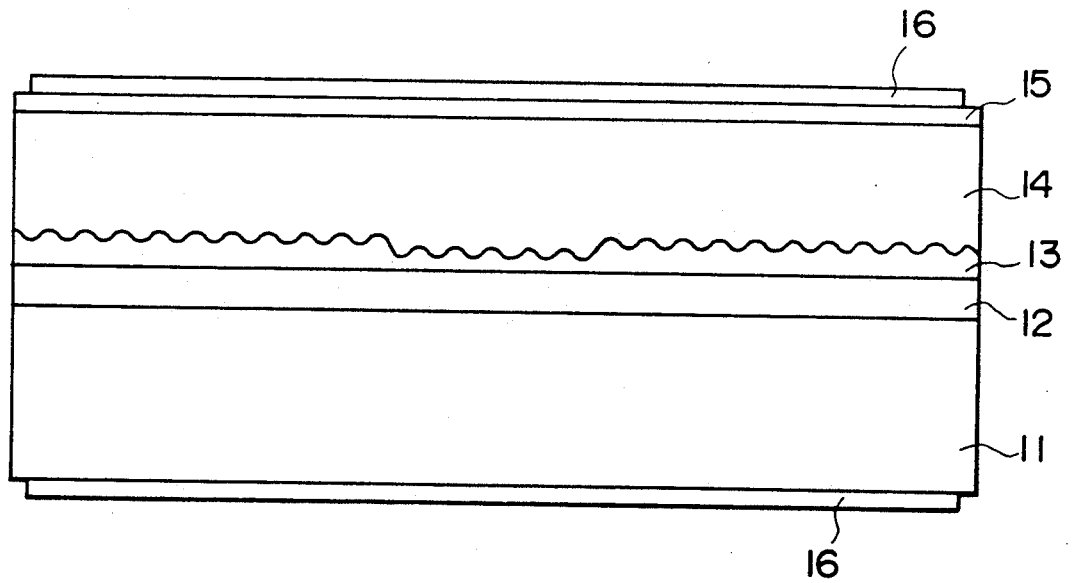

Subsequently, as shown in FIG. 4D, a cladding layer 14 is crystal-grown on the entire surface after the photoresist 18 is removed. The cladding layer 14 is crystal-grown to be much thicker than the step on the waveguide layer 3 formed by the above etching. Therefore, the surface of the cladding layer 14 is almost flattened to have no influence on the electrical and mechanical characteristics of the device. Thereafter, a contact layer 15 is crystal-grown on the cladding layer 14. An electrode 16 is vapor-deposited on the contact layer 15. In addition, AR films (not shown) are deposited on side surfaces of the structure completed by the above steps, thereby completing a laser device. The resonator length of the completed laser device is about 300 μm.

Figure 5:
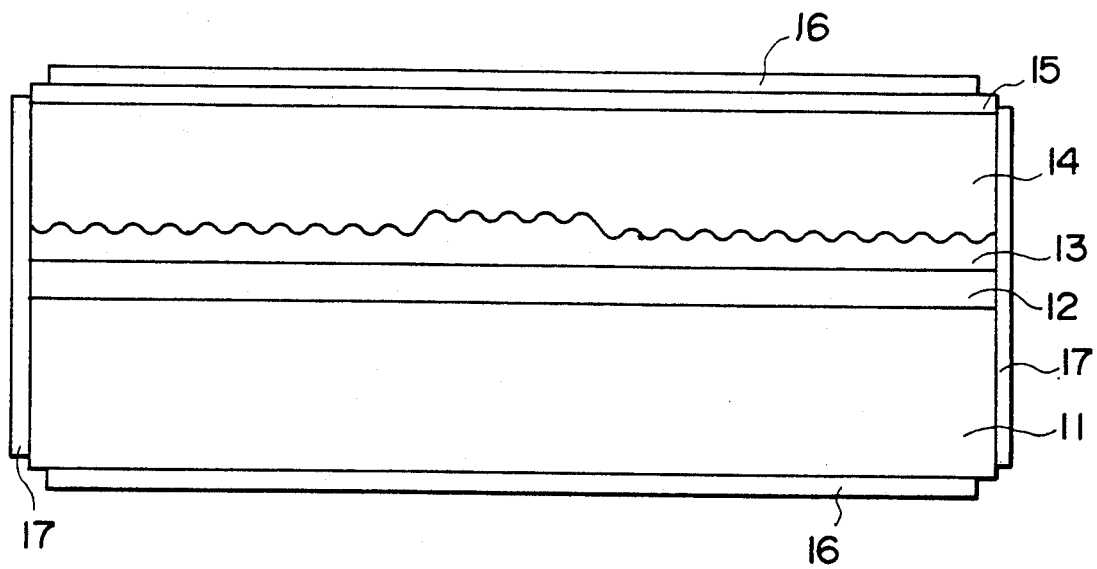
FIG. 5 is a sectional view showing a laser device according to the second embodiment of the present invention.

FIG. 5 shows a phase-shifted distributed feedback laser device according to the second embodiment of the present invention.

In this device, contrary to the above embodiment, a central portion of a waveguide layer 13 is thicker than other portions. The thickened waveguide layer 13 has an effect of shifting a phase. Note that a diffraction grating having a desired depth and a desired shape is present also in a portion other than the phase shift region.

Also in this arrangement, an effect similar to that obtained in the above embodiment can be obtained.

FIGS. 6A to 6D show a method of manufacturing the phase-shifted distributed feedback laser device shown in FIG. 5.

Figure 6A:
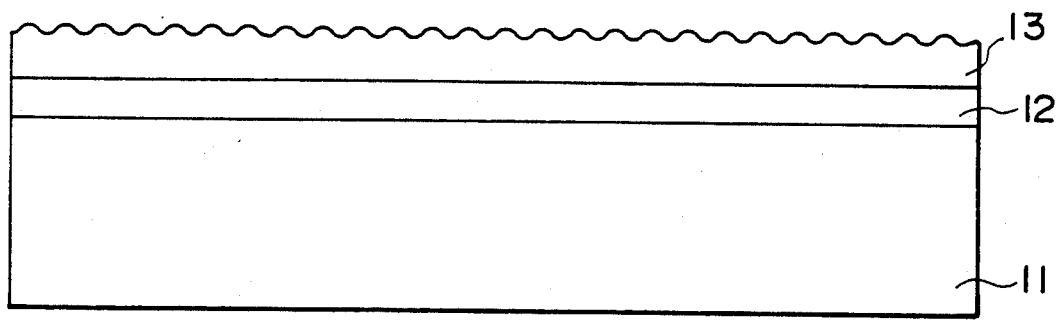
FIG. 6A to 6D are sectional views showing a method of manufacturing the laser device shown in FIG. 5.
Figure 6B:
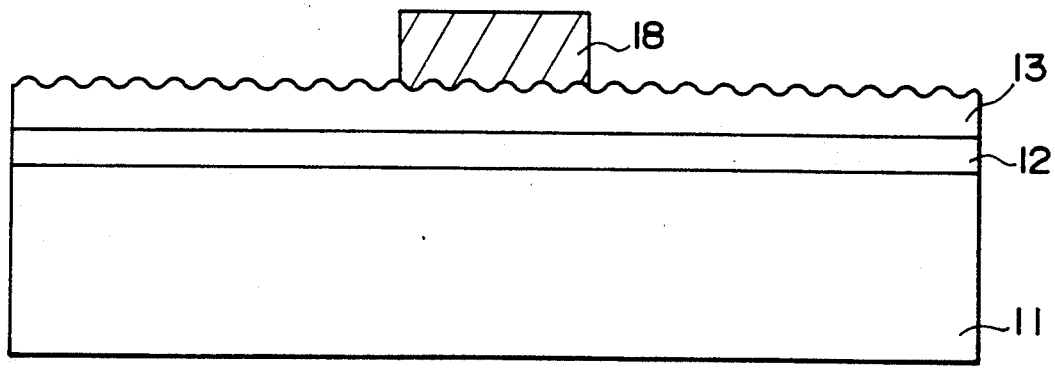
Figure 6C:
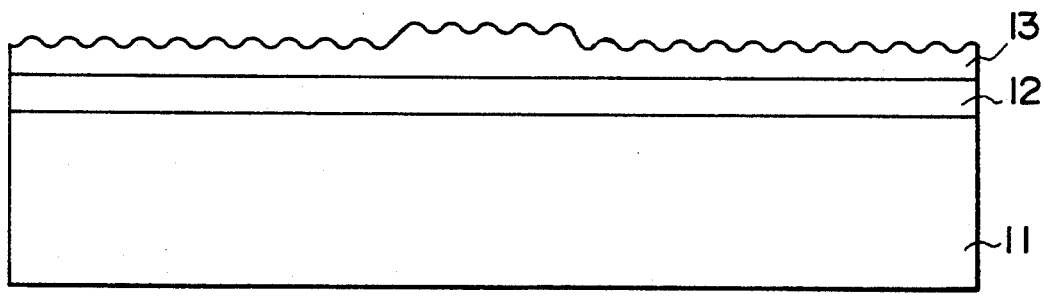

Firstly, as shown in FIG. 6A, a GaInAsP active layer 12 and a waveguide layer 13 are sequentially crystal-grown on an InP substrate 11. Note that the waveguide layer 13 is formed thick in advance. Thereafter, a two-beam interference exposure method using a laser is used to form a diffraction grating on the waveguide layer 13. Subsequently, as shown in FIG. 6B, a photoresist 18 is used to cover a central portion of a resonator to serve as a phase shift region. Subsequently, as shown in FIG. 6C, a hydrogen bromide-based etchant is used to etch the waveguide layer 13 except for the phase shift region, thereby partially forming a step on the waveguide layer 13. Note that the waveguide layer 13 in a portion except for the phase shift region is thinned by etching.

The reason why a hydrogen bromide-based etchant is used as the etchant will be described. That is, the hydrogen bromide-based etchant can etch the waveguide layer 13 while protecting the shape of the diffraction grating of the waveguide layer 13. Since the hydrogen bromide-based etchant has strong etching anisotropy, the diffraction grating can comparatively maintain its original shape even after being etched.

Figure 6D:
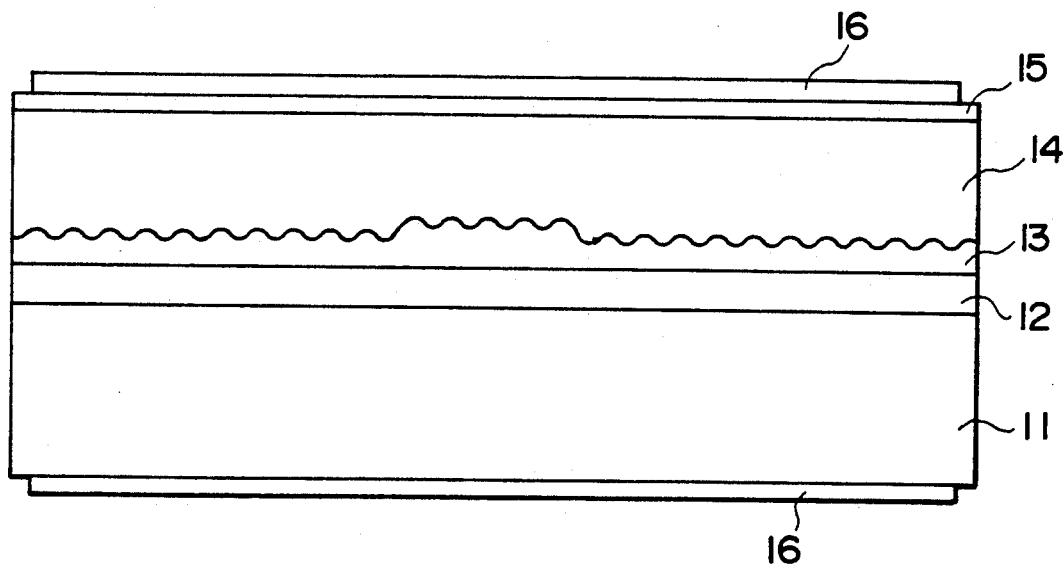

Subsequently, as shown in FIG. 6D, a cladding layer 14 is crystal-grown on the entire surface of the above structure. At this time, the cladding layer 14 is crystal-grown to be much thicker than the step formed in the phase shift region of the waveguide layer 13. Therefore, the surface of the cladding layer 14 is almost flattened to have no influence on the electrical and mechanical characteristics of the device. Thereafter, a contact layer 15 is crystal-grown, and an electrode 16 is vapor-deposited on the contact layer 15. In addition, AR films (not shown) are formed on side surfaces of the structure formed by the above steps to form a laser device.

According to the arrangement shown in the above embodiment, the thickness of the waveguide layer 13 partially changes, and the diffraction grating is present on the upper surface of the waveguide layer 13. In addition, the depth, the shape, and the like of the diffraction grating can be freely controlled. Therefore, concentration of light in the phase shift region can be suppressed to obtain a light intensity distribution free from nonuniformity in the resonator. Note that since the diffraction grating is formed after the active layer and the waveguide layer are crystal-grown, the shape of the diffraction grating has no influence on the crystallinity or the crystal interface of the active layer.

Figure 7A:
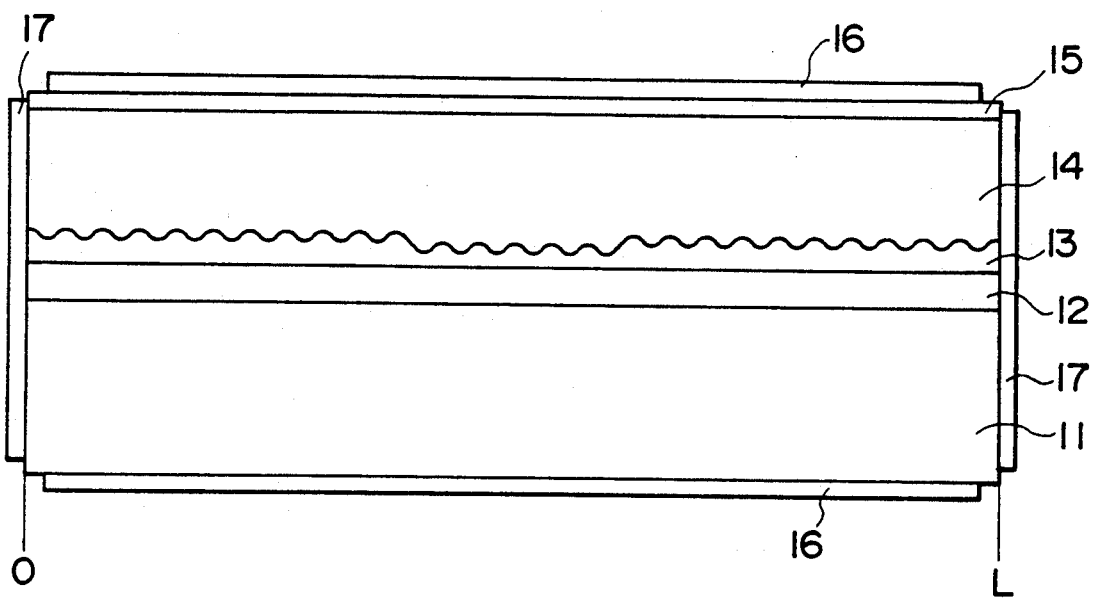
FIGS. 7A and 7B are views showing a light intensity distribution in a resonator of the laser device shown in FIG. 3.
Figure 7B:
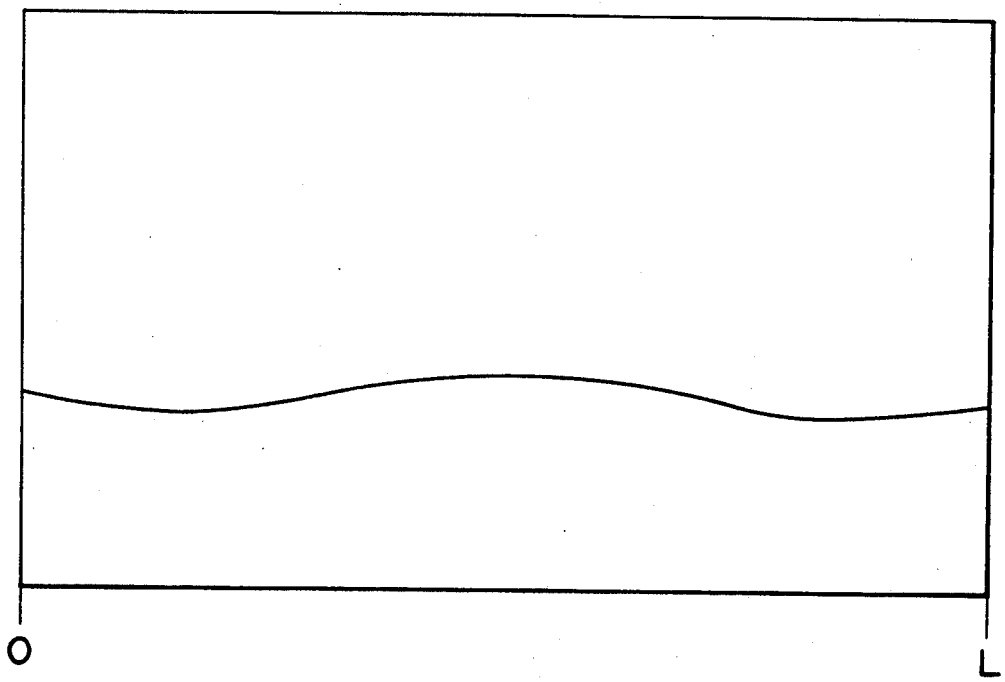

In addition, according to the above method, a diffraction grating having a desired depth and a desired shape can be formed also in the phase shift region. In conventional structures, no diffraction grating is formed in a phase shift region because a step is formed therein. That is, in the present invention, formation of the step and formation of the diffraction grating are simultaneously performed, i.e., at least a portion of the waveguide layer 13 is etched to have a desired thickness while the shape of the periodic projection structure is controlled. As an etching method capable of realizing this effect, an etchant (e.g., a sulfuric acid-based etchant) having weak etching anisotropy is used in the first embodiment. In the second embodiment, an etchant (e.g., a hydrogen bromide-based etchant) having strong etching anisotropy is used. More specifically, since the effective refractive index of the active layer in the phase shift region is different from that in other regions, the propagation constant of a wave in this region is also different. For this reason, the portion having a step has an equivalent effect of shifting a phase. Note that in the first embodiment, light trapping of the active layer 14 in the phase shift region of several tens fm is weaker than that in other regions. Therefore, as shown in FIGS. 7A and 7B, a phase-shifted DFB-LD having a very moderate light intensity distribution in a resonator can be realized. In the second embodiment, a phase-shifted DFB-LD can be realized because the effective refractive index of the active layer 12 in the phase shift region changes. In this case, as compared with the first embodiment, light trapping of the active layer 12 in the phase shift region is stronger than that in other regions. However, the light trapping in the phase shift region can be freely adjusted by changing the shape or depth of the diffraction grating, as described above.

Assuming that the effective refractive index of the phase shift region is Neff1, the effective refractive index of other regions is Neff2, the length of the phase shift region is L, the oscillation wavelength is λ, and the phase shift amount is λ/n, the following relationship is present between the phase shift amount λ/n and the length L of the shift region:

$$\lambda/n = |(Neff1 - Neff2)| \times L \quad (1)$$

If n=4 is substituted into equation (1), the length L of the phase shift region required as a λ/4-shifted type is determined. Neff1 and Neff2 can be obtained by making a model of the type of a device and performing calculations or can be experimentally obtained from an oscillation wavelength of a non-shifted DFB-LD using a uniform diffraction grating.

The present invention provides a technique capable of freely etching a waveguide layer to a desired depth (about 0.12 μm) while controlling the shape of a portion of a uniformly formed diffraction grating, i.e., a technique capable of forming a diffraction grating having a desired depth and a desired shape also in a portion where the thickness of a waveguide layer is changed.

FIG. 8 shows a phase-shifted distributed feedback laser device according to the third embodiment of the present invention.

In this device, the phase shift region shown in the first embodiment is formed at a plurality of (e.g., three) positions in a resonator of about 1.2 mm. Note that in this structure, the phase shift region shown in the second embodiment may be formed at a plurality of positions.

Also in this arrangement, an effect similar to that obtained in the first or second embodiment can be obtained.

FIGS. 9A to 9D show a method of manufacturing the laser device shown in FIG. 8.

Figure 9B:
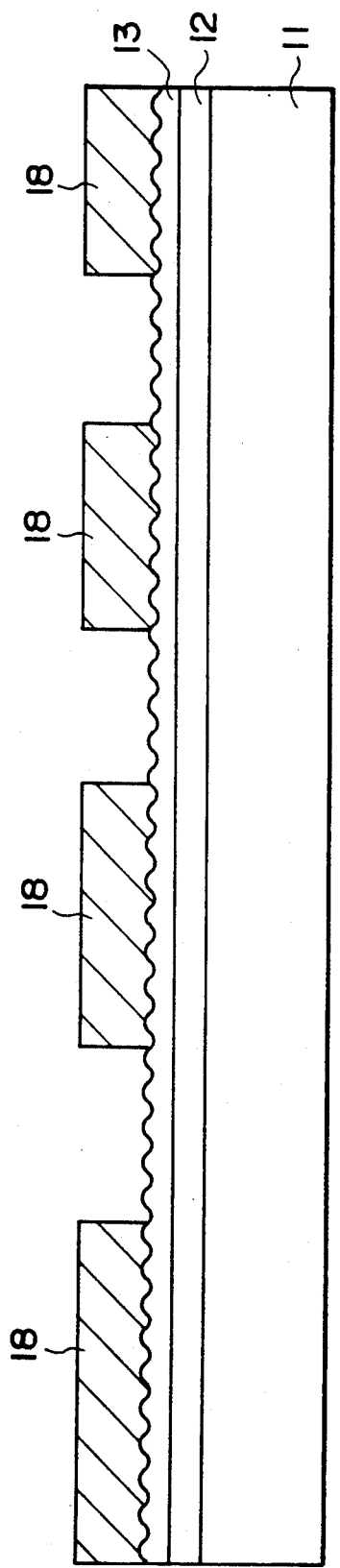
Figure 9C:
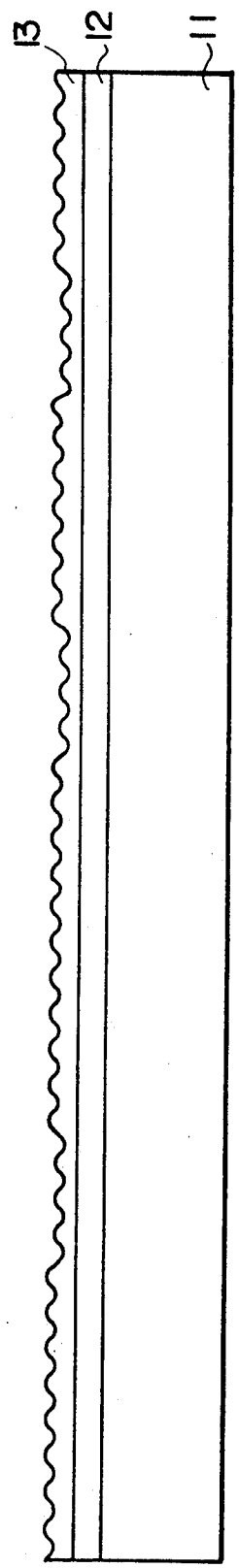
Figure 9D:
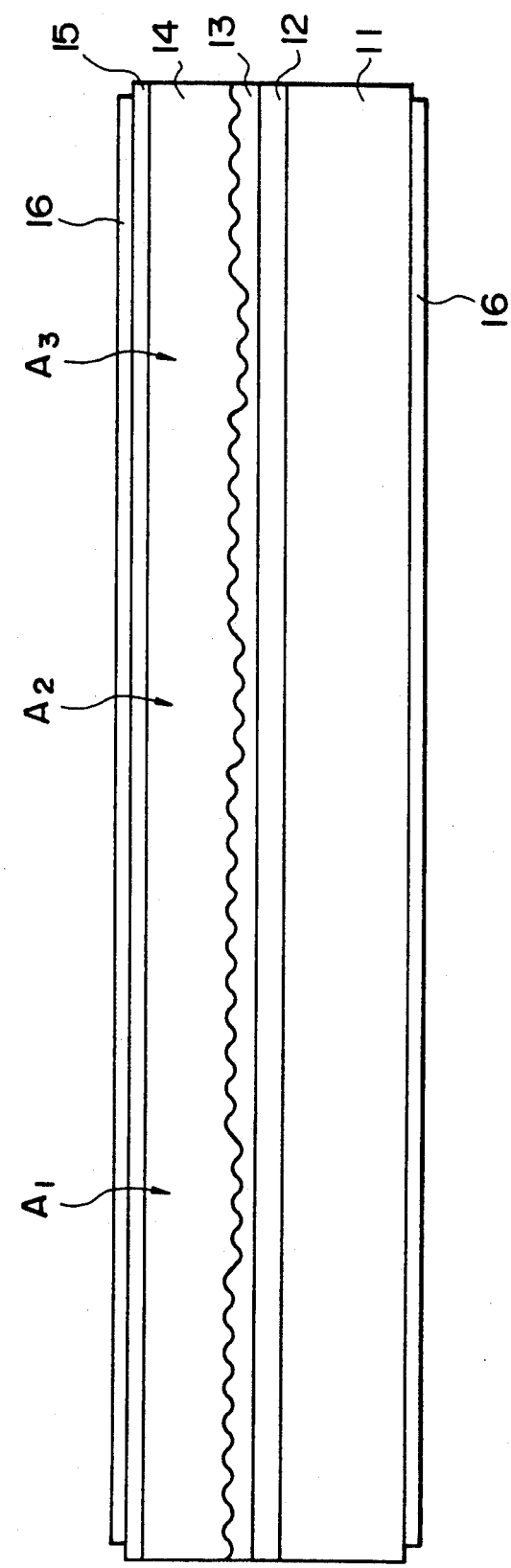

Firstly, as shown in FIG. 9A, a GaInAsP active layer 12 and a waveguide layer 13 are sequentially crystal-grown on an InP substrate 11. Thereafter, a two-beam interference exposure method using a laser is used to form a diffraction grating on the upper surface of the waveguide layer 13. At this time, the depth of projections of the diffraction grating is preferably set small in order to suppress hole burning in the axial direction of a resonator. Subsequently, as shown in FIG. 9B, a photoresist 18 is formed on the waveguide layer 13 and patterned in accordance with the number and positions of phase shift regions. Subsequently, as shown in FIG. 9C, a sulfuric acid-based etchant, for example, is used to etch the waveguide layer 13 to a desired thickness in the phase shift regions. Note that the diffraction grating in each phase shift region is not removed by this etching. Subsequently, as shown in FIG. 9D, a cladding layer 14 is crystal-grown on the entire surface. At this time, the cladding layer 14 is crystal-grown to be much thicker than steps between phase shift regions $A_1$ to $A_3$ and other regions of the waveguide layer 13. Therefore, The surface of the cladding layer 14 is almost flattened to have no influence on the electrical and mechanical characteristics of the device. A contact layer 15 is crystal-grown on the cladding layer 14, and an electrode 16 is vapor-deposited on the contact layer 15. In addition, AR films (not shown) are formed on side surfaces of the structure completed by the above steps.

According to the above arrangement, a DFB-LD which has the phase shift regions $A_1$ to $A_3$ in a plurality of portions and in which the length of a resonator is about 1.2 μm can be formed. As a result, a device having a spectral line width smaller than those in conventional devices can be obtained. According to the present invention, the structure for shifting a phase has a conspicuous effect of suppressing hole burning. Note that the phase shift regions are formed at positions where the spectral line width is minimized. The positions of the three phase shift regions $A_1$ to $A_3$ are arranged asymmetrically with respect to a central portion of the resonator.

Note that although GaInAsP is used in the active layer in each of the above three embodiments, the material is not limited to GaInAsP but may be GaAlAs or the like.

The phase-shifted DFB-LD (invented product) formed by the present invention was manufactured. As a result, it was found that the invented product could operate by a stable single mode even in a high-speed high-output operation. In addition, the invented product was manufactured by changing the depth of a diffraction grating, i.e., the coupling coefficient κ. As a result, it was found that the invented product could operate by a stable single mode comparatively regardless of the value of the coupling coefficient κ. That is, the invented product had the same characteristics as those of a device having a uniform far field pattern. Furthermore, the phase shift structure of the present invention has less projections in a far field pattern and therefore is superior to a structure in which the width near an active layer is changed. This is because the diffraction grating smoothly continues at the boundary of the phase shift region. At this time, the thickness of a waveguide layer in the phase shift region thinned by etching was about 400Å, and the length L of the phase shift region was about 45 μm.

As has been described above, the laser device and the method of manufacturing the same according to the present invention are useful especially to improve the characteristics of a DFB laser device for optical communication.

I claim:

1. A laser device comprising:
   a substrate;
   an active layer formed on the substrate;
   a waveguide layer formed on the active layer and having a phase shift region, the phase shift region being a projecting portion formed in a center of the waveguide layer, a diffraction grating being formed in the entire surface of the waveguide layer including the projecting portion;
   a cladding layer formed on the waveguide layer; and
   electrodes formed on the cladding layer.

2. A laser device comprising:
   a substrate;
   an active layer formed on the substrate;
   a waveguide layer formed on the active layer and having a phase shift region, the phase shift region being a recessed portion formed in a center of the waveguide layer, a diffraction grating being formed in the entire surface of the waveguide layer including the recessed portion, the diffraction grating defining a pattern in the entire surface of the waveguide layer, wherein the diffraction grating pattern in the recessed portion is less pronounced than the diffraction grating pattern in other portions of the waveguide layer;
   a cladding layer formed on the waveguide layer; and
   electrodes formed on the cladding layer.

3. A method for manufacturing a laser device, comprising the steps of:
   forming an active layer on a substrate;
   forming a waveguide layer on the active layer;
   forming a diffraction grating in an entire surface of the waveguide layer by use of a two-beam interference exposure method employing a laser, the diffraction grating defining a pattern in the entire surface of the waveguide layer;
   forming a mask on a portion of the diffraction layer of the waveguide layer;
   etching the waveguide layer by use of an etchant having weak etching anisotropy to form a recessed portion, the diffraction grating pattern in the recessed portion being less pronounced than the diffraction grating pattern in other portions of the waveguide layer;
   forming a cladding layer on the waveguide layer by removing the mask; and
   forming electrodes on the cladding layer.

4. The laser device according to claim 3, wherein the etching step includes partially thinning a portion of the waveguide layer to form the recessed portion in the waveguide layer, the recessed portion serving as a phase shift region.

5. The laser device according to claim 3, wherein the etchant having weak etching anisotropy comprises a sulfuric acid.

6. A method for manufacturing a laser device, comprising the steps of:
   forming an active layer on a substrate;
   forming a waveguide layer on the active layer;

forming a diffraction grating in an entire surface of the waveguide layer by use of a two-beam interference exposure method employing a laser, the diffraction grating defining a pattern in the entire surface of the waveguide layer;

forming a mask on a portion of the diffraction grating of the waveguide layer;

etching the waveguide layer by use of an etchant having strong etching anisotropy, the etchant substantially maintaining the pattern defined by the diffraction grating in the entire surface of the waveguide layer;

forming a cladding layer on the waveguide layer by removing the mask; and forming electrodes on the cladding layer.

7. The laser device according to claim 6, wherein the etching step includes etching the waveguide layer to form a projecting portion serving as a phase shift region, the diffraction grating pattern in the projecting portion being substantially the same as the diffraction grating pattern in other portions of the waveguide layer.

8. The laser device according to claim 7, wherein the etchant having strong etching anisotropy comprises a hydrogen bromide.

* * * * *